United States Patent [19]

Devenyi et al.

[11] Patent Number: 5,396,060
[45] Date of Patent: Mar. 7, 1995

[54] QUADRANT DETECTOR ARRANGEMENT HAVING INTEGRAL LIGHT CHANNELS

[75] Inventors: Gabor Devenyi, West Penetang; Joerg W. Hollmann, Midland, both of Canada

[73] Assignee: Hughes Aircraft Company, Los Angeles, Calif.

[21] Appl. No.: 168,793

[22] Filed: Dec. 7, 1993

[51] Int. Cl.⁶ ............................................. H01J 40/14
[52] U.S. Cl. .............................. 250/214.1; 250/237 R
[58] Field of Search ............... 250/206.1, 206.2, 208.2, 250/208.6, 214.1, 237 R; 257/431, 432, 435; 356/139.02, 139.1, 400, 124, 127

[56] References Cited

U.S. PATENT DOCUMENTS 3,697,761 10/1972 Kamachi ........................ 250/208.2
3,723,013 3/1973 Stirland et al. ................. 250/208.2

*Primary Examiner*—David C. Nelms
*Assistant Examiner*—John R. Lee
*Attorney, Agent, or Firm*—Michael W. Sales; Wanda K. Denson-Low

[57] ABSTRACT

A quadrant detector arrangement (10) includes a quadrant detector (12) having a photosensitive surface (28) and a plurality of light channels (14) extending therethrough. Light from a light source (16) is collimated by a collimating optical element (18) and projected through the light channels (14) toward a workpiece (36) such that light reflected from the workpiece (36) impinges upon the photosensitive surface (28).

17 Claims, 1 Drawing Sheet

QUADRANT DETECTOR ARRANGEMENT HAVING INTEGRAL LIGHT CHANNELS

BACKGROUND OF THE INVENTION

The present invention generally relates to a quadrant detector arrangement and, in particular, relates to one such quadrant detector arrangement having integral light channels.

Quadrant detectors are generally known in the art. Full quadrant detectors are frequently used to optically align a workpiece to a preselected position. For example, in setting up a mechanism, such as an optical bench, the bed of the mechanism can be aligned parallel with a reference plane by use of a precisely positioned quadrant detector disposed in the reference plane but removed from the bed of the mechanism. In such an operation, a mirror is affixed to the bed of the mechanism and, by measuring the relative tilt in the x and y directions with the quadrant detector, the bed can be precisely positioned with respect to the reference plane of the quadrant detector. In such an operation the quadrant detector is, effectively, operated as a null detector, i.e. the goal is to align the reflected light from the bed until each quadrant receives the same amount of reflected light.

Another use for quadrant detectors is the measurement of optical properties, such as astigmatism, of spherical lenses. In such an application, a lens to be measured is disposed so that the light reflected therefrom is directed onto the quadrant detector. The amount of light reflected from the lens is then determined as the lens is rotated. The variation of the light measured in each quadrant gives a measure of the aberration of the lens.

In general, in most quadrant detector arrangements, the apparatus used frequently includes beam splitting optics as well as various lenses. One significant drawback associated with the use of beam spitters is that only about one half of the original light signal is ultimately projected toward the workpiece. Hence, such arrangements generally require powerful light sources and/or relatively sensitive quadrant detector devices.

Consequently, it is highly desirable to provide a quadrant detector arrangement that overcomes the above-recited drawbacks of conventional quadrant detector arrangements.

SUMMARY OF THE INVENTION

Accordingly, it is one object of the present invention to provide a quadrant detector arrangement having integral light channels that overcome the above-recited difficulties.

This object is accomplished, at least in part, by a quadrant detector arrangement having integral light channels. Each quadrant of the quadrant detector arrangement includes a plurality of channels through which collimated light is projected directly onto the workpiece such that the need for beam splitters is avoided.

Other objects and advantages of the present invention will become apparent to those skilled in the art from the following detailed description read in conjunction with the appended claims and the drawings attached hereto.

BRIEF DESCRIPTION OF THE DRAWINGS

The drawings, not drawn to scale, include.

DETAILED DESCRIPTION OF THE INVENTION

Figure 1:
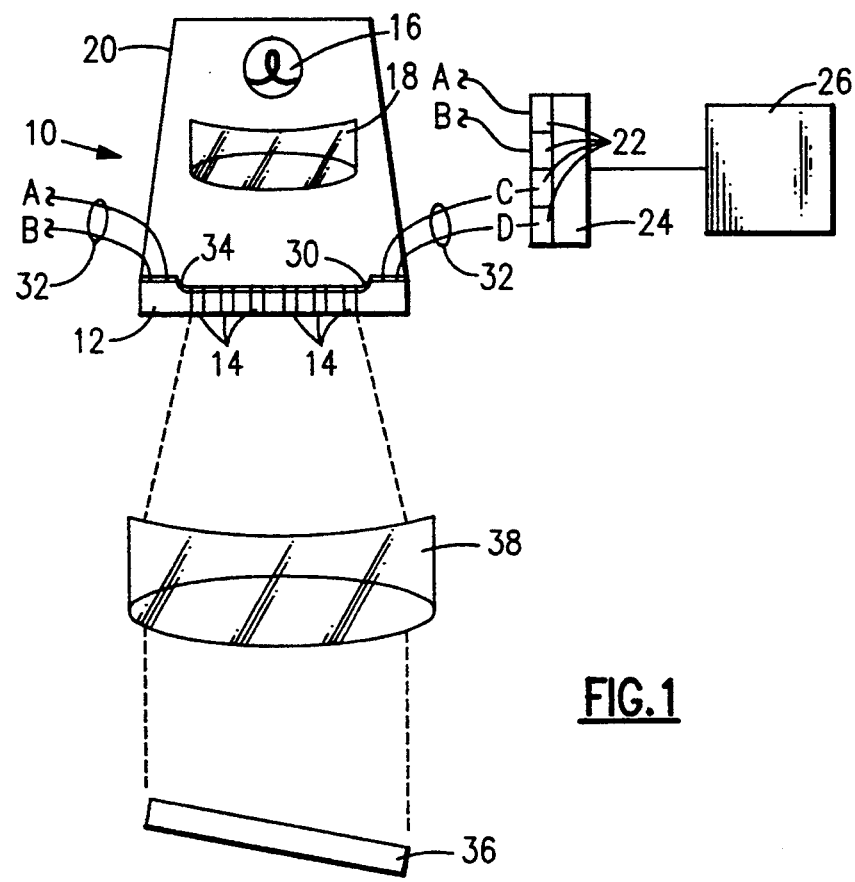
FIG. 1 which is an optical diagram including a quadrant detector arrangement having integral light channels and embodying the principles of the present invention.
Figure 2:
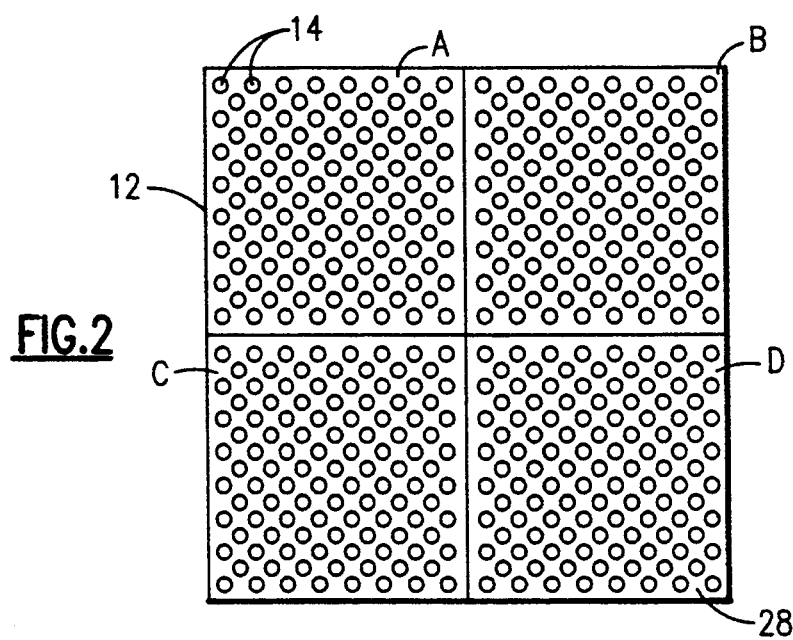
FIG. 2 which is a plan view of the quadrant detector shown in FIG. 1 and embodying the principles of the present invention.

A quadrant detector arrangement having integral light channels, generally indicated at 10 in FIG. 1 and embodying the principles of the present invention, includes a quadrant detector 12 having a plurality of channels 14 therethrough, a light source 16 and a collimating optical element 18. In the preferred embodiment, the light source 16 and the collimating optical element 18 serve as a means for projecting light through the plurality of channels 14.

Preferably, the quadrant detector arrangement 10 further includes a light shield 20, means such as a detector array 22 for receiving signals from each of the quadrants, A, B, C, and D, of the quadrant detector 12, means such as a computer coupled to the detector array 24 for processing the signals from the signal receiving means 22 and a display 26 for displaying the processed signals.

In the preferred embodiment, the quadrant detector 12 includes a photosensitive surface 28 and an opposing light reflecting surface 30. Preferably, the light reflecting surface 30 is disposed proximate the light source 16. The integral light channels 14 extend through the photosensitive surface 28 and the light reflecting surface 30. The quadrant detector 12 further includes means 32, associated with each quadrant, A, B, C, and D, for conducting electrical signals from the quadrant detector 12 to the means 22 for receiving signals.

Typically, the photosensitive surface 28 is made from a material such as silicon that generates a photocurrent in accordance with the amount of light impinging upon the photosensitive surface 28. Further, the light reflecting surface 30 is, preferably, provided with a non electrically conductive coating 34 to ensure that only light impinging upon the photosensitive surface 28 contributes to the electrical signals reaching the detector array 22. In the preferred embodiment, the non electrically conductive coating 34 extends into the channels 14.

The integral light channels 14, preferably, are uniform in diameter and equally distributed among the quadrants, A, B, C, and D. Hence, the amount of light exiting the quadrant detector 12 is the same for each quadrant, A, B, C, and D. Consequently, each quadrant, A, B, C, and D, has the same physical surface area of the photosensitive surface 28 allocated thereto.

It will be understood that the size of the channels 14 is uniform although the number, pattern, and size thereof is variable and can be adjusted as desired. In one specific embodiment, the channels 14 have a diameter of about 0.10 inches and each quadrant, A, B, C, and D, is provided with 113 channels 14. In such an embodiment, the photosensitive surface 28 of the quadrant detector 12 is 0.320 inches by 0.320 inches square.

As shown in FIG. 1, the collimating optical element 18 is disposed between the light source 16 and the light reflecting surface 30 of the quadrant detector 12. The light source 16 can be a halogen lamp or an LED lamp or the like, and is disposed such that the light therefrom is collimated by the optical element 18. Hence, the light striking the quadrant detector 12 is equally distributed across the light reflecting surface 30. Consequently, the amount of light exiting each channel 14 is the same. As a result, the amount of light impinging on a workpiece 36 from each quadrant, A, B, C, and D, is the same.

In one embodiment, the collimating optical element 18 has a diameter of about 0.490 inches and an effective focal length of about 1.97 inches and is disposed about 1.97 inches from the light source 16 and, since it provides collimated light can be disposed an arbitrary distance from the light reflecting surface 30.

As shown in FIG. 1, the quadrant detector arrangement 10 includes a light shield 20 that encases the light source 16, the collimating optical element 18 and the quadrant detector 12. The light shield 20 is provided to prevent stray light from entering the channels 14 and thus causing unbalanced light among the quadrants, A, B, C, and D. In the preferred embodiment, the light shield 20 is formed from sheet metal or a like material and is disposed in a light tight manner about the quadrant detector 12, the light source 16, and the collimating optical element 18. Typically, the means 22 for receiving signals from each of the quadrants, A, B, C, and D, includes a current-to-voltage amplifier 38 that convert and amplify the photocurrent generated by the photosensitive surface 28 of the quadrant detector 12.

In one embodiment, the means 24 for processing signals from the signal receiving means 22 is a preprogrammed computer that receives the electrical signals outputted from the signal receiving means 22. In one particular embodiment, the means 24 includes a personal computer. Typically, for autocollimation, for example, the means 24 for processing signals first generates a sum of the signals from the quadrants, A, B, C, and D, as follows: A+D; B+C; A+B; and D+C. Thereafter, the x-coordinate is calculated by the difference determination (A+D)×(B+C). Similarly, the y-coordinate signal is calculated by the difference determination (A+B)×(D+C). Then, in the preferred embodiment, to make these coordinate signals independent of the intensity of the reflected light, each coordinate signal is divided by the sum of the four quadrant signals (A+B+C+D). The resultant normalized signals are then inputted to the means 26 for displaying the output from the processing means 24.

The display 26 provides a visible output representation of the light impinging upon each quadrant, A, B, C, and D. Typically, the display will be either a video display on a video monitor or a graphical display on a plotter, or both.

In operation, as shown in FIG. 1, the quadrant detector 12 is disposed in a reference plane and light from the channels 14 is directed toward the workpiece 36 through a collimating lens 38, for example, having a diameter of about 2.50 inches and an effective focal length of about 14 inches, that ensures that the light impinges upon the workpiece 36 as a parallel beam. The reflected light is then received by the quadrants, A, B, C, and D, of the photosensitive surface 28. The photocurrent thus generated is processed as described above and the result displayed by the means 26. The workpiece 36 is then aligned, preferably in real time, until each quadrant, A, B, C, and D, receives an equal amount of reflected light from the workpiece 36. At that point the workpiece 36, will be aligned perpendicular to the collimated light beam.

Although the present invention has been described herein with respect to one or more specific embodiments, it will be understood that other configurations and arrangements may also be made that do not depart for the spirit and scope of this invention. Hence, the present invention is deemed limited only by the appended claims and the reasonable interpretation thereof.

What is claimed is:

1. A quadrant detector arrangement; comprising:
   a quadrant detector having a photosensitive surface and a plurality of light channels therethrough; and
   means for projecting light through said light channels toward a workpiece such that light reflected from said workpiece impinges upon said photosensitive surface.

2. The quadrant detector arrangement as claimed in claim 1 wherein said quadrant detector further comprises:
   a light reflecting surface, said light reflecting surface opposing said photosensitive surface and disposed proximate said light projecting means.

3. The quadrant detector arrangement as claimed in claim 2 wherein said light reflecting surface includes a non electrically conductive coating.

4. The quadrant detector arrangement as claimed in claim 3 wherein said non electrically conductive coating extends into said light channels.

5. The quadrant detector arrangement as claimed in claim 1 wherein said light channels are equally disposed among the quadrants of said quadrant detector.

6. The quadrant detector arrangement as claimed in claim 5 wherein each said quadrant includes 113 light channels.

7. The quadrant detector arrangement as claimed in claim 6 wherein each said light channel has a diameter of about 0.01 inches.

8. The quadrant detector arrangement as claimed in claim 1 further comprising:
   a light shield, said light shield being disposed about said light projecting means and said quadrant detector such that stray light is prevented from entering said light channels.

9. The quadrant detector arrangement as claimed in claim 8 wherein said light shield is formed from sheet metal and is disposed in a light tight manner about said light projecting means and said quadrant detector.

10. The quadrant detector arrangement as claimed in claim 1 wherein said light projecting means includes a light source and a collimating optical element, said collimating optical element being disposed between said light source and said quadrant detector.

11. The quadrant detector arrangement as claimed in claim 1 further comprising:
    means for receiving electrical signals from said quadrant detector; and
    means, associated with each quadrant of said quadrant detector, for conducting electrical signals from said quadrant detector to said means for receiving signals from each said quadrant detector.

12. The quadrant detector arrangement as claimed in claim 11 wherein said means for receiving electrical signals from said quadrant detector includes a plurality of current-to-voltage amplifiers, each said current-to-voltage amplifier being disposed to receive electrical signals from only one of said quadrants of said quadrant detector.

13. The quadrant detector arrangement as claimed in claim 11 further comprising:

means for processing signals from said signal receiving means, said means for processing signals producing an output signal; and means for displaying said output signal from said signal processing means.

14. The quadrant detector arrangement as claimed in claim 13 wherein said means for displaying said output signal includes a video display.

15. The quadrant detector arrangement as claimed in claim 1 further comprising:

a light shield, said light shield being disposed about said light projecting means and said quadrant detector such that stray light is prevented from entering said light channels; and said light projecting means includes a light source and a collimating optical element, said collimating optical element being disposed between said light source and said quadrant detector.

16. The quadrant detector arrangement as claimed in claim 15 further comprising:

means for receiving electrical signals from said quadrant detector; and means, associated with each quadrant of said quadrant detector, for conducting electrical signals from said quadrant detector to said means for receiving signals from each said quadrant detector.

17. The quadrant detector arrangement as claimed in claim 16 further comprising:

means for processing signals from said signal receiving means, said means for processing signals producing an output signal; and means for displaying said output signal from said signal processing means.

* * * * *